(12) United States Patent
Alzaher

(10) Patent No.: US 12,500,575 B2
(45) Date of Patent: Dec. 16, 2025

(54) CANONICAL LOWPASS FILTER WITH DIGITALLY PROGRAMMABLE CUTOFF FREQUENCY SETTINGS USING CURRENT FOLLOWERS

(71) Applicant: KING FAHD UNIVERSITY OF PETROLEUM AND MINERALS, Dhahran (SA)

(72) Inventor: Hussain Abdullah Alzaher, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 114 days.

(21) Appl. No.: 18/594,739

(22) Filed: Mar. 4, 2024

(65) Prior Publication Data
US 2025/0279767 A1    Sep. 4, 2025

(51) Int. Cl.
*H03H 11/12*    (2006.01)
*H03F 3/45*    (2006.01)

(52) U.S. Cl.
CPC ..... *H03H 11/1291* (2013.01); *H03F 3/45475* (2013.01); *H03H 11/1204* (2013.01); *H03F 2200/129* (2013.01)

(58) Field of Classification Search
CPC ............ H03H 11/1291; H03H 11/1204; H03F 3/45475; H03F 2200/129
See application file for complete search history.

(56) References Cited

U.S. PATENT DOCUMENTS 6,806,765 B2 * 10/2004 Giuroiu .............. H03H 11/0433
                                                      327/552
8,872,580 B2    10/2014 Alzaher
(Continued)

FOREIGN PATENT DOCUMENTS

CN        102299657 A    12/2011

OTHER PUBLICATIONS

Minaei et al. ; A new CMOS electronically tunable current conveyor and its application to current-mode filters ; IEEE Transactions on Circuits and Systems I: Regular Papers vol. 53, Issue 7 ; Jul. 10, 2006 ; Abstract Only ; 1 Page.
(Continued)

*Primary Examiner* — Lincoln D Donovan
*Assistant Examiner* — Amit R Bhatia
(74) *Attorney, Agent, or Firm* — Oblon, McClelland, Maier & Neustadt, L.L.P.

(57)    ABSTRACT

A second-order low-pass canonical filter designed for precise signal processing and a method for assembling and a method for low pass filtering a current signal are described. The filter comprises two main stages. The first stage includes a current source that feeds into a first programmable current division network (CDN), which is in series with a first current follower (CF) having a single output terminal. This arrangement is followed by a first three output terminal CF circuit. The second stage consists of a second CDN network connected in series with the negative output of the first three output terminal CF circuit. A second single output terminal CF in series with the second $CDN_2$ is connected to a second three output terminal CF, whose negative output terminal provides a low pass filtered output current $I_0$. This filter architecture is particularly advantageous for applications requiring stable and adjustable frequency filtering capabilities.

15 Claims, 9 Drawing Sheets

(56) References Cited

U.S. PATENT DOCUMENTS

2014/0015602 A1* 1/2014 Alzaher ............. H03H 11/11
327/553
2015/0256148 A1 9/2015 Alzaher

OTHER PUBLICATIONS

Alzaher et al. ; A CMOS Highly Linear Channel-Select Filter for 3G Multistandard Integrated Wireless Receivers ; IEEE Journal of Solid-State Circuits, vol. 27, No. 1 ; Jan. 2002 ; 11 Pages.

* cited by examiner

CANONICAL LOWPASS FILTER WITH DIGITALLY PROGRAMMABLE CUTOFF FREQUENCY SETTINGS USING CURRENT FOLLOWERS

BACKGROUND

Technical Field

The present disclosure is directed to electronic signal filtering, and more specifically to the design and implementation of low pass filters with digitally programmable cutoff frequency settings using current followers.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Low pass active filters are integral components in a multitude of electronic applications, where their primary function is to mitigate high-frequency noise and interference from signals. These filters find extensive application not only in consumer electronics, such as speakers and subwoofers, but also play a crucial role in systems across various industries, including biomedical devices, digital to analog converters, signal processing for anti-aliasing, wave analyzers, audio amplifiers, and equalizers.

Conventional analog filters, in contrast to their switched-capacitor counterparts, do not require preprocessing steps, such as discretization, anti-aliasing, and the like. Additionally, the analog filters do not require clock generation as well. Therefore, analog filters are used in environments where supply voltages are low and power consumption needs to be minimized. In such applications having low supply voltage, analog tuning methods, such as gm-C or MOSFET-C techniques, of the analog filter have their limitations in terms of tuning range. In one solution, digital tuning of filters may be implemented, primarily due to its ability to offer a broad tuning range.

Filters made with current division networks (CDN) are known for being able to adjust over a wide range without needing fine-tuning. However, even with CDNs, an unpredictability factor pertaining to the core setting of the filter remain in determining which frequencies are passed. The challenge of the core setting of the filter arises as it depends on the exact values of the parts used in the filter, which can vary by a large amount. When the parts do not match up perfectly with the desired values, the filter does not work as expected and needs to be adjusted. Moreover, during the adjustment of one parameter in the filter for tuning, a disturbance in the settings of other parameters can be generated, adversely affecting the strength and precision of the filter. Such challenges may result in less reliable and harder to use filters.

Patent Application US20150256148A1 describes a reconfigurable second generation current conveyor (CCII) having a filter stage including a current follower (DCCF) in series with a CDN. However, the application uses the circuit has a large number of active devices and employs more than one type of active device apart from the CDN making it expensive and heavy.

Non-patent literature, "A new CMOS electronically tuneable current conveyor and its application to current-mode filters" describes an electronically tenable second-generation current conveyor (ECCII) for realizing a universal current-mode filter which has a single output and two inputs. The ECCII uses a different tuning technique, which is analog based. Also, the CDN used in the ECCII has no relationship with the analog based tuning.

Each of the aforementioned disclosures suffers from one or more drawbacks hindering their adoption. Accordingly, it is one object of the present disclosure to provide methods and systems for implementing a low pass filter for electronic devices that can be digitally tuned by adjusting the settings of desirable parameters without affecting the settings of other parameters.

SUMMARY

In an exemplary embodiment, a second-order low-pass canonical filter is described. The second order low-pass canonical filter includes a first stage and a second stage. The first stage includes a current source $I_i$ connected in series with an input terminal of a first programmable current division network, a first single output terminal current follower ($CF_1$) in series with the first programmable current division network, and a first three output terminal current follower circuit ($CF_2$) in series with the first single output terminal current follower. The second stage includes a second programmable current division network, in series with a negative output terminal of the first three output terminal current follower circuit ($CF_2$), a second single output terminal current follower ($CF_3$) in series with the second programmable current division network, and a second three output terminal current follower circuit ($CF_4$) in series with the second single output terminal current follower ($CF_3$), wherein a negative output terminal of the second three output terminal current follower circuit ($CF_4$) is configured to generate a low pass filtered output current $I_O$.

In an exemplary embodiment, a method for assembling a second order low-pass canonical filter is described. The method includes forming a first stage by connecting a current source $I_i$ in series with an input terminal of a first programmable current division network, connecting a first single output terminal current follower ($CF_1$) in series with the first programmable current division network, connecting a first three output terminal current follower circuit ($CF_2$) in series with the first single output terminal current follower. The method further includes forming a second stage by connecting a second programmable current division network in series with a negative output terminal of the first three output terminal current follower circuit ($CF_2$), connecting a second single output terminal current follower ($CF_3$) in series with the second programmable current division network, connecting a second three output terminal current follower circuit ($CF_4$) in series with the second single output terminal current follower ($CF_3$) and generating a low pass filtered output current $I_O$ at the negative output terminal of the second three output terminal current follower circuit ($CF_4$).

In another exemplary embodiment, a method for low pass filtering a current signal is described. The method includes injecting, by a current source, an input current $I_i$ into a first stage circuit including an input terminal of a first programmable current division network having a first digital control input $\beta_1$, generating, by the first programmable current division network, a fractional output $\beta_1 I_i$ of the input current $I_i$, transmitting the fractional output $\beta_1 I_i$ to an input terminal of a first single output terminal current follower (CF$_1$), generating, by the first single output terminal current follower (CF$_1$), a first buffered fractional output current, transmitting the first buffered fractional output current to a first three output terminal current follower circuit (CF$_2$) in series with the first single output terminal current follower, generating, by the first three output terminal current follower circuit (CF$_2$), a first stage output current I$_1$, transmitting the first stage output current I$_1$ to a second stage circuit including an input terminal of a second programmable current division network in series with a negative output terminal of the first three output terminal current follower circuit (CF$_2$), generating, by the second programmable current division network, a fractional output current $\beta_2 I_1$ of the first stage output current I$_1$, transmitting the fractional output current $\beta_2 I_1$ to an input terminal of a second single output terminal current follower (CF$_3$), generating, by the second single output terminal current follower (CF$_1$), a second buffered fractional output current, transmitting the second buffered fractional output current to an input terminal of a second three output terminal current follower circuit (CF$_4$) in series with the second single output terminal current follower (CF$_3$), and generating, by the second three output terminal current follower circuit (CF$_2$), a low pass filtered output current I$_o$ from a negative output terminal of the second three output terminal current follower circuit (CF$_4$).

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
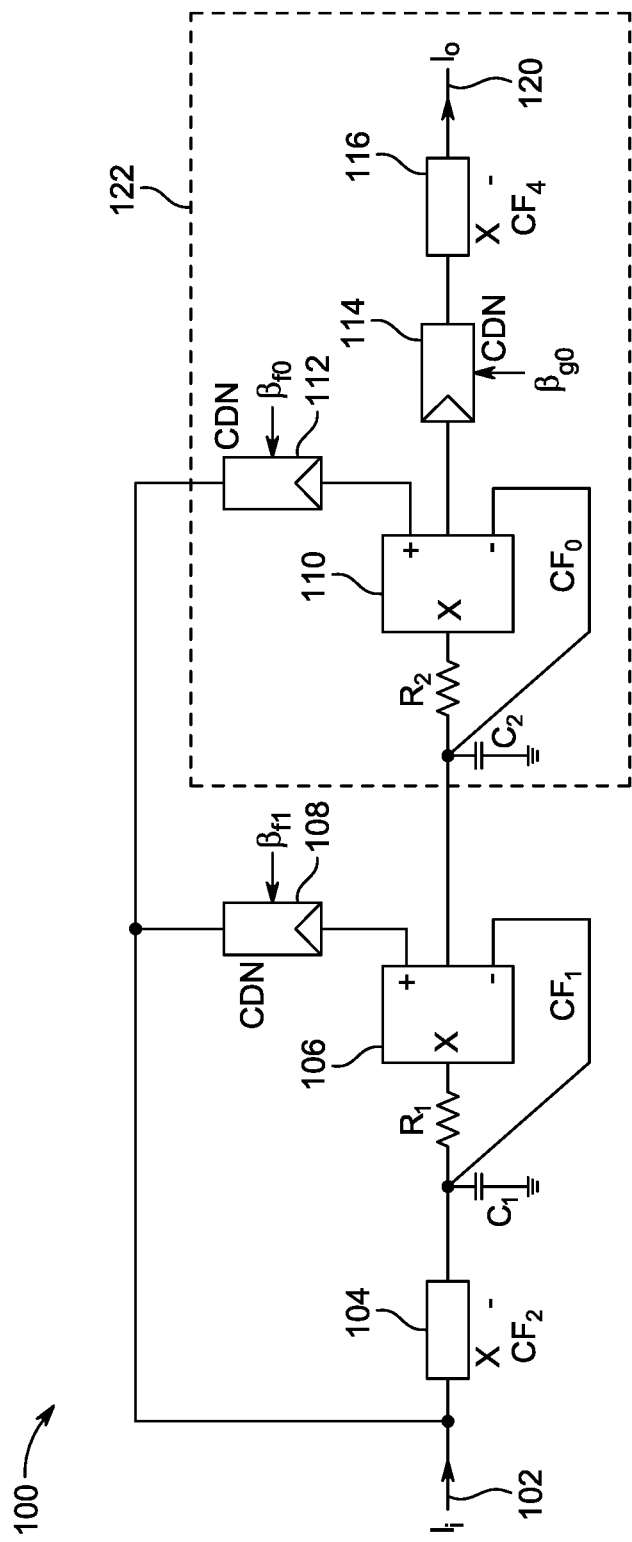
FIG. 1 depicts a schematic layout of a conventional second-order low pass.

In the drawings, like reference numerals designate identical or corresponding parts throughout the several views. Further, as used herein, the words "a", "an" and the like generally carry a meaning of "one or more", unless stated otherwise.

Furthermore, the terms "approximately," "approximate", "about" and similar terms generally refer to ranges that include the identified value within a margin of 20%, 10%, or preferably 5%, and any values therebetween.

Aspects of this disclosure are directed to a system, device, and method for configuring a second-order low pass filter with a digitally programmable cutoff frequency, which is achieved through the use of current division networks (CDNs) and current followers (CFs). The filter is capable of precisely adjusting the pole frequency ($\omega_o$) without affecting the quality factor (Q) or the current gain (A$_i$) of the filter.

The present disclosure relates to a combination of single-output and multi-output CFs, along with CDNs to allow for the programming of $\omega_o$. By adjusting the digital control inputs ($\beta$ parameters) across the CDNs, the cutoff frequency can be fine-tuned, which is verified through experimental results. The configuration of the filter achieves operational efficiency, with reduced power consumption and component count in the later figures, all while maintaining independent control of critical parameters of the filter.

FIG. 1 depicts a schematic layout of a conventional second-order low pass filter 100. The second-order low pass filter 100 is obtained from the general n$^{th}$ order structure utilizing current division networks (CDNs) and current followers (CFs) as depicted in the FIG. 1. The filter shown in FIG. 1 is a prior art circuit which was configured to provide attenuations. In an example, the attenuations can be used for frequency scale down.

As depicted in the FIG. 1, the conventional filter 100 includes two CFs having a single output, two CFs having three outputs, three CDNs, and four passive components including two resistors and two capacitors. In one implementation, all of the CFs are configured as current amplifiers with unity gain. The CFs are implemented to mirror the input current at their respective outputs, for effectively maintaining integrity of the signal without amplification or attenuation of the signal. In one example, audio amplifiers, where maintaining the pure characteristics of sound signals is needed, are implemented with filters with CFs. In another example, the CFs are applied in equalizers for regulating tone without distorting the original composition of the input signal.

The CDN is a circuit configuration that divides an input current into multiple branches, usually through a network of transistors that are controlled digitally. The purpose of a CDN is to enable the precise and programmable division of current for various applications, such as tuning the characteristics of a filter 100. In a CDN, the input current I$_{in}$ is divided into different paths, each path having a binary-weighted scaling factor applied to it. This binary weighting is controlled by digital bits, allowing for fine-grained control over the division of current.

The output current (I$_o$) is the sum of all the branched currents measured after their respective scaling. In one aspect, filters with CDNs are capable of providing a 10-bit tuning range without trimming and with inherent linearity, unlike other analog tuning methods. The CDNs do not consume the DC power. In one example, CDNs are implemented for applications requiring a linear response over a wide range of frequencies, such as in wave analyzers or biomedical instruments where precision is paramount.

A first single output CF, depicted as CF$_2$ 104, is configured to receive an input current I$_i$ 102 at a CF$_2$ input terminal, denoted as X. The CF$_2$ 104 is configured as a non-inverted current follower. The non-inverted output of the CF$_2$ 104 is fed to a first three output CF, depicted as CF$_1$ 106, as an input through a first RC circuit formed by R$_1$ and $C_1$. The three output terminals include a positive output terminal, a first central negative output terminal, and a second negative output terminal. The $CF_1$ 106 is configured to receive the input at a $CF_1$ 106 input terminal X and output the current at the first central negative output terminal (−) which is further provided as an input to a second CF 110. The second negative output terminal (−) of the $CF_1$ 106 is fed back to the first RC circuit as feedback. The positive output terminal is coupled to a first CDN, depicted as CDN 108, which is then fed back to the input terminal X of $CF_2$ 104. The $CF_2$ 104, the $CF_1$ 106, and the CDN 108 form a first stage of the second order low pass filter 100.

A second three output CF is depicted as $CF_0$ 110. CF 110, similar to the $CF_1$ in configuration, includes one input terminal and three output terminals. The three output terminals include a positive output terminal, a first central negative output terminal, and a second negative output terminal. $CF_0$ 110 is configured to receive an input current at a $CF_0$ 110 input terminal X and output the current at the first central negative output terminal (−) which is further provided as an input to a second CF having a single output, depicted as $CF_4$ 116, through a third CDN, depicted as CDN 114. The second negative output terminal (−) of $CF_0$ 110 is fed back to the second RC circuit. The positive output terminal is coupled to a second CDN, depicted as CDN 112. The negative terminal of the output of the fourth CF 116 (−) is configured to output current L 120 $CF_0$ 110, $CF_4$ 116, CDN 112, and CDN 114 form a second stage 122 of the second order low pass filter 100.

CDN 108 and CDN 112 form a feedback path conveying inverting outputs of the $CF_1$ 106 and $CF_0$ 110 to the input terminal of $CF_2$ 104. Each CDN is configured with adjustable digital control input β, where β=current out/current in=$\Sigma_{i-1}{}^n d_i 2^{-1}$, and where n is the size of the control word and d is the $i^{th}$ digital bit. The CDN 108 is configured with $\beta_{f1}$ and $CDN_2$ 112 is configured with $\beta_{f0}$, and $CDN_3$ 114 is configured with $\beta_{g0}$.

The transfer function of the second-order low pass filter 100 is given by equation (1).

$$T(s) = \frac{I_o}{I_i} = \frac{\frac{\beta_{g0}}{R_1 R_2 C_1 C_2}}{s^2 + s\frac{\beta_{f1}}{R_1 C_1} + \frac{\beta_{f0}}{R_1 R_2 C_1 C_2}}. \quad (1)$$

The performance of the filter 100 is characterized by equations (2), (3), and (4), which define the current gain ($A_i$), the pole frequency ($\omega_o$), and the pole quality factor (Q).

$$A_i = \frac{\beta_{g0}}{\beta_{f0}}. \quad (2)$$

$$\omega_o = \sqrt{\frac{\beta_{f0}}{R_1 R_2 C_1 C_2}}. \quad (3)$$

$$Q = \sqrt{\frac{\beta_{f0} R_1 C_1}{\beta_{f1}^2 R_2 C_2}}. \quad (4)$$

The configuration of CDNs allows for fine-tuning of the pole frequency ($\omega_o$) with high accuracy, despite the usual 50% variance in monolithic RC time constants. This precision tuning is achieved without disturbing the pre-set values of the current gain ($A_i$) and the pole quality factor (Q), circumventing the typical trade-offs seen in conventional filters. The $A_i$, Q, and ωo parameters are calculated for achieving the desired filter characteristics, with $A_i$ and Q being set accurately via resistor and capacitor ratios, whereas ωo is dependent on the absolute values of these components. However, practical implementation of the filter requires tuning of $\omega_o$ that does not alter $A_i$ and Q, which leads to the requirement of a filter allowing independent control of $\omega_o$ without disturbing the other two parameters.

Figure 2:
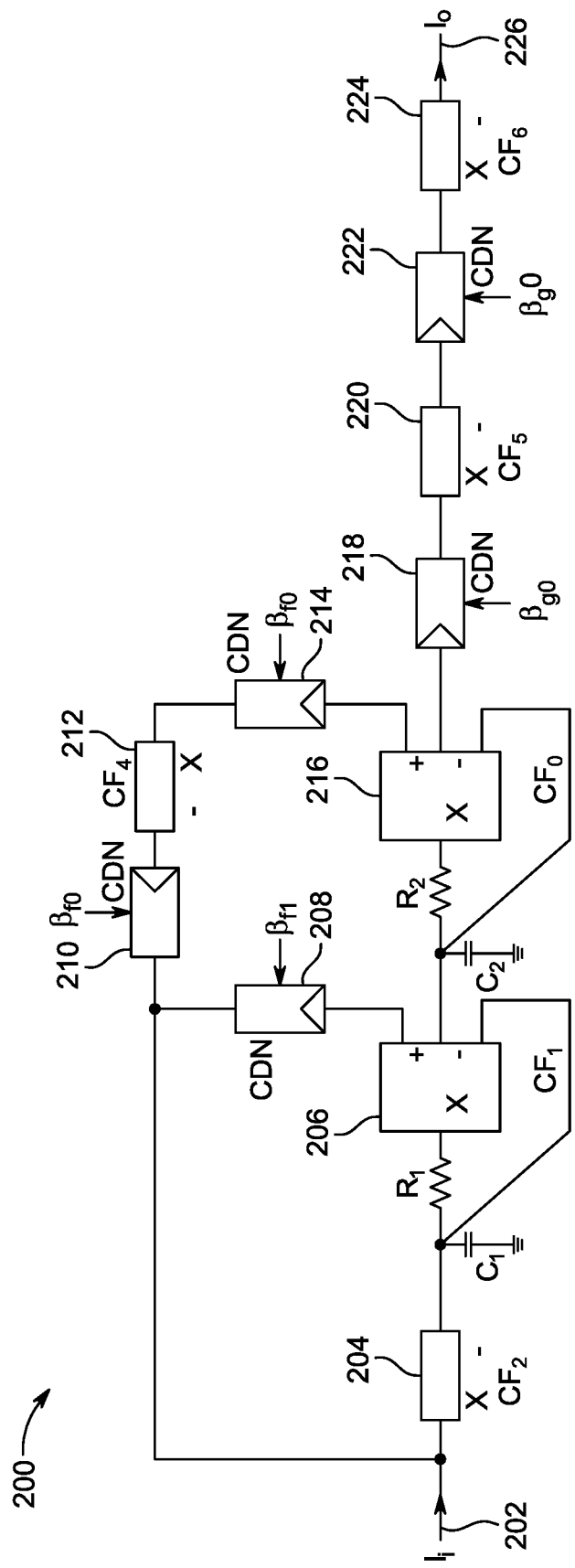
FIG. 2 illustrates an enhanced second-order low pass filter configuration, according to certain embodiments.

FIG. 2 illustrates an enhanced second-order low pass filter 200 configuration. The filter 200 incorporates four single-output current followers (CFs), two multi-output CFs each with three outputs, and five current division networks (CDNs). Similar to the filter 100 in FIG. 1, the enhanced second-order low pass filter 200 utilizes two resistors and two capacitors to characterize the filtering action.

The configuration of the filter 200 is designed around the capability to program the pole frequency parameter ($\omega_o$) through the simultaneous modulation of $\beta_{g0}$, $\beta_{f0}$, and $\beta_{f1}$, while maintaining unchanged values for the pole quality factor (Q) and current gain ($A_i$). Specifically, $\omega_o$ is tuned by adjusting Bro, and concurrently, $A_i$ and Q are preserved by proportionally modifying $\beta_{g0}$ and $\beta_{f1}$, ensuring that the ratios $\beta_{g0}:\beta f_1:\beta_{f0}$ remain consistent. Such simultaneous programming is facilitated by the coordination of the five CDNs.

According to an aspect, the first stage of the filter 200 is formed by a first CF having a single output ($CF_2$ 204), which receives an input current ($I_i$) 202 at its input terminal X. $CF_2$ 204, functioning as a non-inverted current follower, forwards its output to a first CF with three outputs ($CF_1$ 206) through a first RC circuit comprising resistor $R_1$ and capacitor $C_1$. $CF_1$ 206 receives the input at its input terminal X and delivers the current from its first central negative output terminal to a second CF with three outputs ($CF_0$ 216). A second negative output terminal of the $CF_1$ 206 provides feedback to the first RC circuit formed by $R_1$ and $C_1$. The inverting output terminal of $CF_1$ 206 is connected to a first CDN (CDN 208), which attenuates the current according to its adjustable digital control input $\beta_{f1}$ before it is fed back to the input of $CF_2$ 204. Together, $CF_2$ 204, $CF_1$ 206, and CDN 208 compose the first stage of the filter 200.

The second stage is formed by $CF_0$ 216, which receives input at its input terminal X and channels the current from its first negative output terminal to a second CF with a single output ($CF_5$ 220), interfacing through a fourth CDN (CDN 218). A second negative output terminal of $CF_0$ 216 supplies feedback to a second RC circuit formed by $R_2$ and $C_2$. A positive output terminal of the $CF_0$ 216 channels the output to a third CF having a single output ($CF_4$ 212), interfacing through a third CDN (CDN 214). An output terminal of the $CF_4$ 212 is connected in series with a second CDN (CDN 210)

CDN 218 which receives the current from the first negative output terminal of the $CF_0$ 216 is connected in series with the $CF_5$ 220. The output terminal of the $CF_5$ 220 forwards the output current to a fifth CDN (CDN 222). From the CDN 222, the current is supplied to a fourth CF having a single output terminal ($CF_6$ 224). The output current ($I_o$) 226 of the filter 200 is collected at the output terminal of the $CF_6$ 224. $CF_0$ 216, $CF_4$ 212, CDN 214 112, and CDN 210 collectively establish the second stage of the low pass filter 200.

The transfer function of modified filter 200 (FIG. 2) is given by equation (5):

$$T(s) = \frac{I_o}{I_i} = \frac{\beta_{g0}^2 / C_1 C_2 R_1 R_2}{s^2 + s\beta_{f1}/C_1 R_1 + \beta_{f0}^2 / C_1 C_2 R_1 R_2}. \quad (5)$$

The parameters of the corresponding filter 200 are given respectively as follows:

$$A_i = \left(\frac{\beta_{go}}{\beta_{f0}}\right)^2 \quad (6)$$

$$\omega_o = \sqrt{\frac{\beta_{f0}^2}{C_1 C_2 R_1 R_2}}. \quad (7)$$

$$Q = \frac{\beta_{f0}}{\beta_{f1}} \sqrt{\frac{C_1 R_1}{C_2 R_2}}. \quad (8)$$

Therefore, the parameter $\omega_o$ can be programmed by simultaneously changing $\beta_{go}$, $\beta_{f0}$, and $\beta_{f1}$ without disturbing Q and/or gain. $\omega_o$ is programmed by varying $\beta_{f0}$ while $A_i$ and Q can be maintained unchanged by adjusting $\beta_{g0}$ and $\beta_{f0}$ accordingly such that $\beta_{go}=\beta_{f1}=\beta_{f0}$ are maintained. This is achieved by programming the five CDNs simultaneously.

Figure 3:
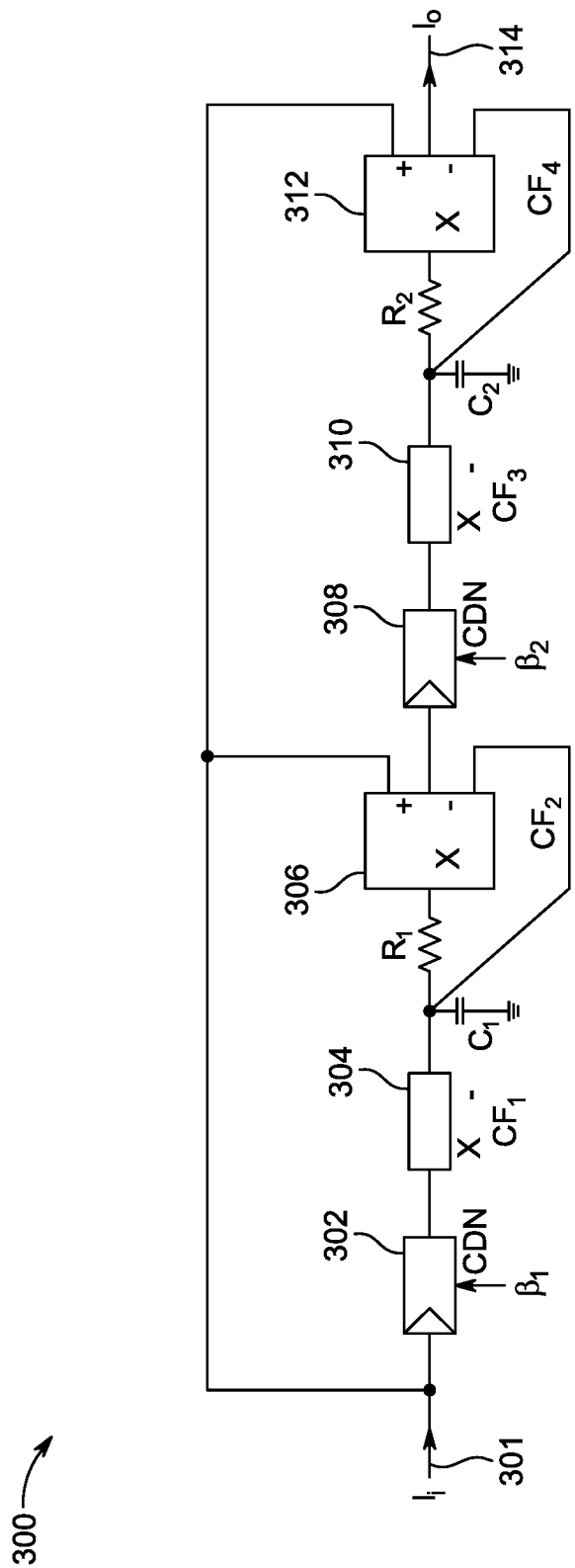
FIG. 3 illustrates an exemplary structure of a canonical second-order low pass filter, according to certain embodiments.

FIG. 3 illustrates an exemplary structure of a canonical second-order low pass filter 300. The filter 300 utilizes two single-output current followers (CFs), two CFs with three outputs, and two current division networks (CDNs), all while maintaining the same count of passive components, two resistors and two capacitors.

In one aspect, the pole frequency ($\omega_o$) of the filter 300 is adjustable independently of the current gain ($A_i$) and the pole quality factor (Q) by setting $\beta_1=\beta_2$, where $\beta$ represents the current gain which is defined as the ratio of the output current to the input current. The configuration is thus optimized to allow for the pole frequency to be fine-tuned without affecting $A_i$ or Q, which is accomplished through a reduced count of CDNs as compared to FIG. 2, signifying a more efficient design.

The first stage of the filter 300 includes a first CF with a single output terminal (CF$_1$ 304) and a first CF with three output terminals (CF$_2$ 306). A current source $I_i$ 301 is connected in series with an input terminal of a first programmable current division network (CDN 302). The input current is received at an input terminal of the first programmable CDN 302 and then supplied to a first single output terminal current follower (CF$_1$ 304). CF$_1$ 304 is connected in series with the CDN 302. From CF$_1$ 304, a three output current follower circuit CF$_2$ 306 receives the current at its input terminal X through a first RC circuit having circuit elements R$_1$ and C$_1$. The capacitor C$_1$ has a positive terminal connected to the output terminal of the first single output terminal current follower circuit (CF$_1$) and a negative terminal connected to ground. The resistor R$_1$ is connected between the positive terminal of the first capacitor C$_1$ and an input terminal (X) of CF$_2$ 306.

The CF$_2$ 306 is configured with two feedback paths. First, a positive feedback path is formed by connecting the positive feedback terminal of the CF$_2$ 306 to the input terminal of the first programmable current division network (CDN 302). Second, a negative feedback path is formed by connecting the negative feedback terminal of the first three output terminal current follower circuit (CF$_2$) to the first terminal of the first capacitor C$_1$.

A positive terminal of CF$_2$ 306, forming the positive feedback path, is connected to CDN 302 in series with CF$_1$ 304. CF$_2$ 306 processes the input and routes the current from its first negative output terminal to an input terminal of the second programmable current division network (CDN) 308. An output terminal of CDN 308 is connected to an input terminal of a second CF having a single output terminal (CF$_3$ 310).

The second stage of the filter 300 is formed by the second programmable current division network (CDN 308), the second single output terminal current follower (CF$_3$ 310), and a second three output terminal current follower circuit (CF$_4$ 312). CDN 308 is connected in series with the first inverting output terminal, a negative output terminal (−), of the CF$_2$ 306. CDN 308 receives the current from CF$_2$ 306 and routes the current to the input terminal X of the CF$_3$ 310. The CF$_3$ 310 is connected in series with the second CDN 308. From CF$_3$ 310, the current is supplied to an input terminal X of a three output CF, denoted as CF$_4$ 312, through a second RC circuit having a second resistor R$_2$ and a second capacitor C$_2$. C$_2$ has a positive terminal connected to an output terminal of the second single output current follower circuit (CF$_3$) 310 and a negative terminal connected to ground. R$_2$ is connected between the positive terminal of the second capacitor C$_2$ and an input terminal (X) of the second three output terminal current follower circuit (CF$_4$) 312.

The CF$_4$ 312 is configured with two feedback paths. A second positive feedback path is formed by connecting the positive feedback terminal of CF$_4$ 312 to the first positive feedback path. A second negative feedback path is formed by connecting the negative feedback terminal of CF$_4$ 314 to the positive terminal of the second capacitor C$_2$.

CF$_4$ 312 is connected in series with CF$_3$ 310. A negative output terminal or a first inverting output terminal of the CF$_4$ 312 is configured to generate a low pass filtered output current $I_o$ 314.

The transfer function of the filter 300 is depicted by equation (9):

$$T(s) = \frac{I_o}{I_i} = \frac{\frac{\beta_1 \beta_2}{R_1 R_2 C_1 C_2}}{s^2 + s\frac{\beta_1}{R_1 C_1} + \frac{\beta_1 \beta_2}{R_1 R_2 C_1 C_2}}. \quad (9)$$

Thus, the filter 300 exhibits pole frequency $\omega_o$, pole quality factor Q, and gains of $A_i$:

$$A_i = 1 \quad (10)$$

$$\omega_o = \sqrt{\frac{\beta_1 \beta_2}{R_1 R_2 C_1 C_2}}. \quad (11)$$

$$Q = \sqrt{\frac{\beta_2 R_1 C_1}{\beta_1 R_2 C_2}}. \quad (12)$$

According to an aspect, the configuration of the filter 300 is realized by configuring the components as precise values and implementing digitally programmable cutoff frequency settings. Programmability is achieved using a plurality of CDNs for tuning a digitally controlled current follower (DCCF). Gain control is realized by utilizing a multi-output digitally controlled current amplifier (MDCCA), which provides independent control of the filter coefficients. In the implementation of this filter, the digital control inputs $\beta_1$ and $\beta_2$ are programmed by adjusting the digital control words that dictate the division of current in the CDNs. These control words determine the binary-weighted division of the input current across the various branches of the CDNs, effectively setting the $\beta$ values. In an implementation, setting the $\beta$ values could involve setting digital switches or using a controller 600, such as shown and described in FIGS. 6-9, to write the control words to the CDNs. A control word is defined as a word whose individual bits represent a control signal. The control words are related to an instruction that is stored in microprogram memory. It is a set of microinstructions in a micro-routine. The control word consists of bits, and each bit corresponds to a function or commands such as Pause, Stop, Enable, Start, Stop, Move, Jog, etc.

A first control input $\beta_1$ is connected to CDN 302. The first control input $\beta_1$ is configured to program a pole frequency $\omega_{01}$ of the first current division network. A second control input $\beta_2$ is connected to the $CDN_2$ 308. The second control input $\beta_2$ is configured to program a pole frequency $\omega_{02}$ of the second programmable current division network (CDN). $\beta_1$ and $\beta_2$ are each selected from a range of 0 to 1. The pole frequency of the filter 300 can be adjusted independent of gain and quality factor by choosing $\beta_1=\beta_2$.

In one exemplary aspect, the passive components are configured with the values, $R_1=_R2=50$ k$\Omega$ and $C_2=2C_1=20$ nF. The highest $f_o=\omega_0/2\pi$ is found when $\beta_1=\beta_2=0.875$, which corresponds to a digital word 111. The middle response is obtained when $\beta_1=\beta_2=0.5$, which corresponds to a digital word 100. The lowest response is when $\beta_1=\beta_2=0.25$, which corresponds to a digital word 010. The corresponding theoretical and experimental values for each of $\beta$ configuration are as follow:

For $\beta_1=\beta_2=0.875$, theoretical value: 131 kHz, and experimental value: 110 kHz.

For $\beta_1=\beta_2=0.5$, theoretical value: 5 kHz, and experimental value: 60 KHz.

For $\beta_1=\beta_2=0.25$, theoretical value: 38 kHz, and experimental value: 35 kHz.

The deviations in theoretical values and the experimental values are mainly due to the internal capacitance at the Trip-Zone (TZ) (pin no 5) of the AD844 (The AD844 is fabricated by Analog Devices, located at One Analog Way Wilmington, MA 01887, USA) of the prototype which resulted in lower values of the measured pole frequencies compared with the theoretical counterparts.

The filter 300 achieves the desired design criterion with two single output CFs, 2 CFs having 3 outputs, and two CDNs while using the same number of passive components as its counterparts as described with reference to FIG. 2. Thus, it can be understood that in comparison with the filter 200, the filter 300 has two CFs and three CDNs less than the circuit 200 of FIG. 2, which results in lower power consumption, a smaller footprint, and better performance. The filter 300 also has a wider cut-off frequency tuning range, and ability of digital tuning instead of analog tuning and higher frequency operation since current followers have higher bandwidth compared to op-amps.

Figure 4:
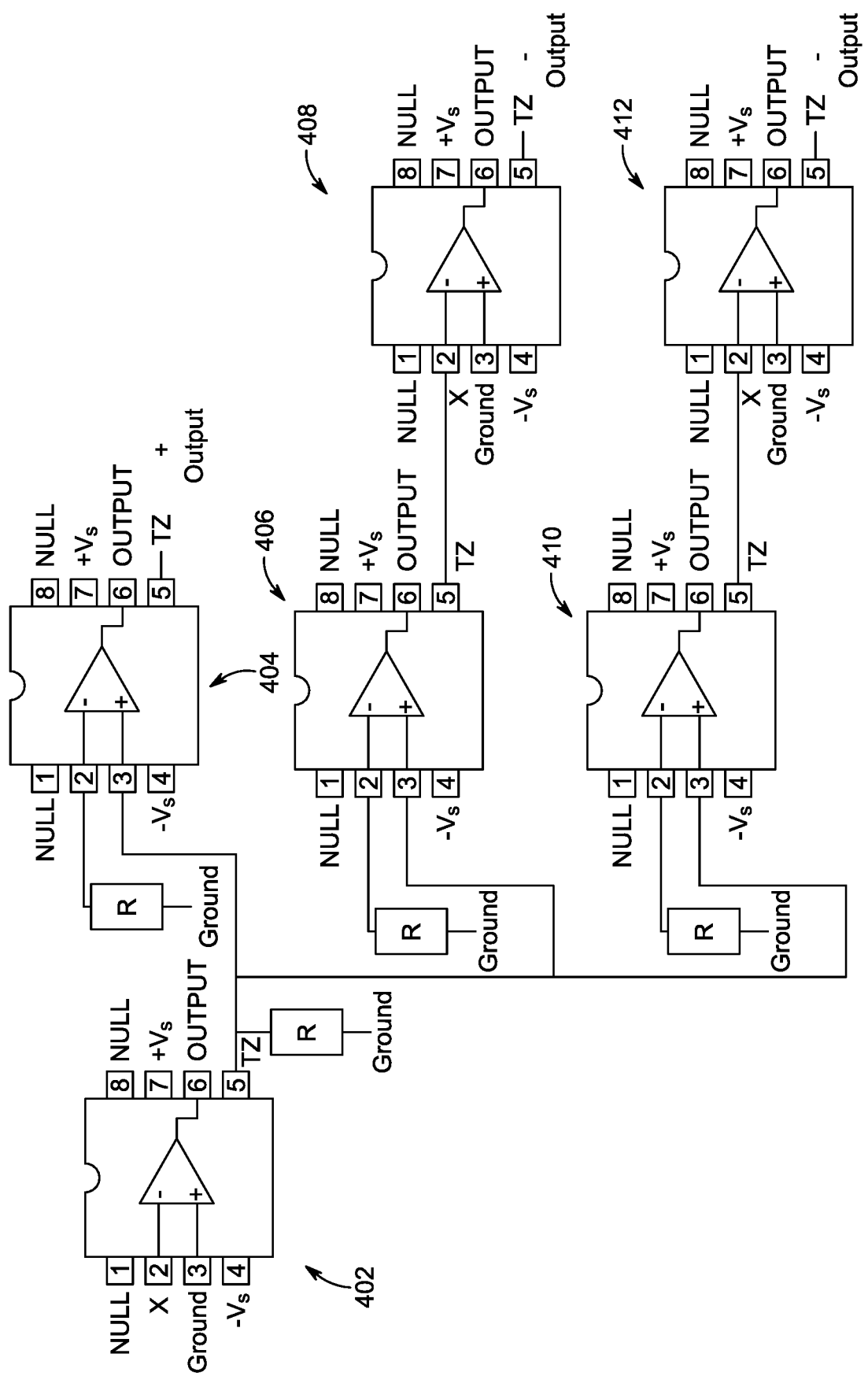
FIG. 4 illustrates a detailed schematic of a multi-output current follower circuit employed within the second-order low pass filter, according to certain embodiments.

FIG. 4 illustrates a detailed schematic of a multi-output current follower (CF) circuit employed within the second-order low pass filter. The functionality of the $CF_2$ and $CF_4$ of the filter 300, as depicted in FIG. 3, are realized by using three operational amplifiers to provide the multiple outputs.

As illustrated in FIG. 4, the schematic shows a configuration of three operational amplifiers (op-amps) configured to provide three output terminals. In a non-limiting example, the op-amps are AD844s (The AD844 is fabricated by Analog Devices, located at One Analog Way Wilmington, MA 01887, USA. In one implementation, the operational amplifiers are configured to realize a multi-output CF. The current source I/initiates the circuit flow, entering a first op-amp 402, at the non-inverting input terminal. This first op-amp 402, operating as a non-inverting amplifier, presents its output via Pin 6, which then progresses to the input of a second op-amp 404 in the sequence.

The second op-amp 404 is configured as an inverting amplifier, thereby reversing the phase of the signal received from the first op-amp 402, and outputting (+) output at output terminal pin 6. The output of this inverting stage is subsequently directed to the third op-amp 406.

The first op amp 402 is connected in series with the third op-amp 406 and a fifth op-amp 410.

The third op-amp 406 is in the series with a fourth op-amp 408, also referred to as a fourth op-amp 408. The third op-amp is configured to deliver the transient current to the slewing (TZ) node at Pin 5 via a short signal path. In one aspect, the current available to charge the capacitance (about 4.5 pF) at the TZ node is always proportional to the input error current, and the slew rate limitations associated with the large signal response of the op-amps do not occur. Therefore, the rise and fall times are almost independent of signal level.

The fourth op-amp 408 is configured in a non-inverting configuration which delivers the (−) output at the output terminal. The output provides central negative output for the CF.

Similar to the third op-amp 406 and the fourth op-amp 408, a fifth op-amp 410 is connected to a sixth op-amp 412. The transient current of the fifth op-amp 410 is delivered to the sixth op-amp which inverts the input current phase to deliver the (−) output at the output terminal (pin 6).

These six op-amps are interconnected with passive components, resistors, and capacitors (not explicitly shown in the provided description) that may form part of the RC circuits for filtering purposes.

Figure 5:
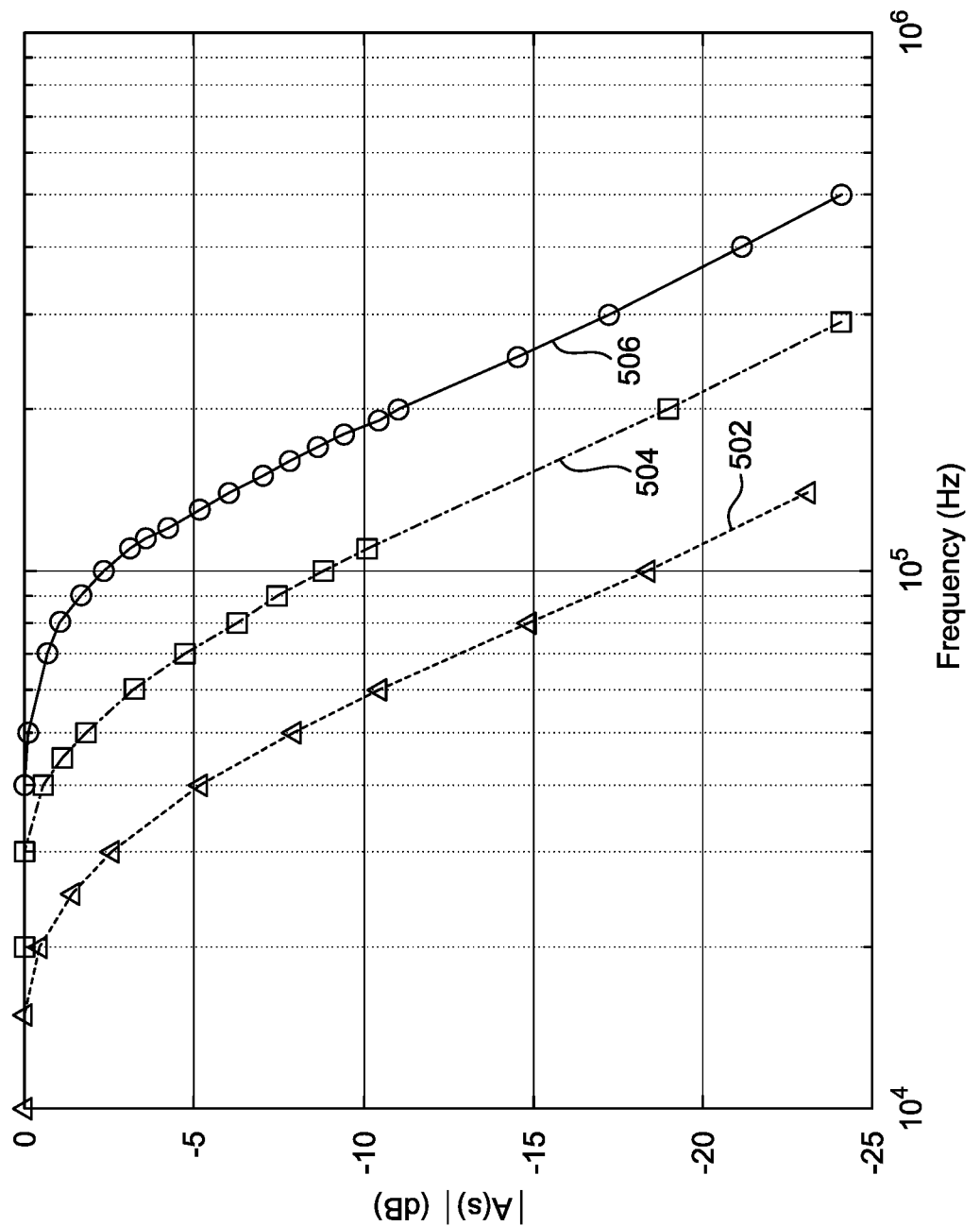
FIG. 5 presents a graphical representation of the experimental results obtained for the second-order low pass filter, according to certain embodiments.

FIG. 5 presents a graphical representation of the experimental results obtained for the second-order low pass filter 300. FIG. 5 displays the magnitude of the filter's response in decibels (dB) across a range of frequencies (Hz) on a logarithmic scale. The passive components of the filter were selected to be $R_1=R_2=50$ k$\Omega$, and $C_2=2C_1=20$ nF. The configuration of resistors and capacitors is instrumental in determining the cutoff frequency of the filter and its overall frequency response. The plotted data points reveal the magnitude of output of the filter in decibels as a function of frequency, illustrating the attenuation characteristics of the filter over the specified frequency range. Each of curves 502, 504, and 506 on the graph corresponds to different settings of the $\beta$ parameter, which is indicative of the programmable current division ratios set within the current division networks (CDNs) of the filter. The response 506 is obtained when $\beta1=\beta2=0.875$ (digital word 111). The response 504 is obtained when $\beta1=\beta2=0.5$ (digital word 100). The response 502 is obtained when $\beta1=\beta2=0.25$ (digital word 010).

The effectiveness and precision of the filter 300 makes the filter suitable for various application, particularly in the communication and biomedical fields. With the advent of 5G technology, the demand for high-performance receivers is paramount. Modern receivers, particularly direct conversion, or homodyne receivers, require active low pass filters for channel selection purposes. The filter of the present disclosure can be used to isolate individual channels from the broad spectrum used in 5G communications, ensuring clear and distinct signal reception amidst the high-frequency bandwidths employed. The precise tunability of the filter allows for adaptability to different frequency bands and standards, which is a necessity in the dynamically changing environment of wireless communications.

In the field of biomedical engineering, electrobiological measurements, such as electrocardiography (ECG) for heart monitoring, electromyography (EMG) for recording muscular contractions, electroencephalography (EEG) for brain activity analysis, and magnetoencephalography for measuring magnetic fields produced by neural activity, all rely on capturing and interpreting delicate bioelectrical signals. The high precision of the filter in frequency filtering can remove unwanted noise and interference from these signals, enhancing the clarity and accuracy of the measurements. The low power consumption and programmability of the filter are particularly advantageous for portable biomedical devices, where power efficiency and adaptability to different signal types are crucial.

The first embodiment is illustrated with respect to FIG. 2-FIG. 5. The first embodiment describes the second order low-pass canonical filter. The second order low-pass canonical filter includes a first stage and a second stage. The first stage includes a current source $I_i$ connected in series with an input terminal of a first programmable current division network (CDN 302), a first single output terminal current follower (CF$_1$) in series with the first programmable current division network (CDN 302), and a first three output terminal current follower circuit (CF$_2$) in series with the first single output terminal current follower. The second stage includes a second programmable current division network (CDN 308) in series with a negative output terminal of the first three output terminal current follower circuit (CF$_2$), a second single output terminal current follower (CF$_3$) in series with the second programmable current division network (CDN 308), and a second three output terminal current follower circuit (CF$_4$) in series with the second single output terminal current follower (CF$_3$). A negative output terminal of the second three output terminal current follower circuit (CF$_4$) is configured to generate a low pass filtered output current $I_0$.

In one aspect, the three output terminals of each of the three output terminal current follower circuits are configured to have a positive feedback terminal, a negative feedback terminal and a negative output terminal.

In one aspect, the first three output terminal current follower circuit (CF$_2$) includes a first capacitor $C_1$ having a positive terminal connected to the output terminal of the first single output terminal current follower circuit (CF$_1$) and a negative terminal connected to ground, a first resistor $R_1$ connected between the positive terminal of the first capacitor $C_1$ and an input terminal (X) of the first three output terminal current follower circuit (CF$_2$), a first positive feedback path configured to connect the positive feedback terminal of the first three output terminal current follower circuit (CF$_2$) to the input terminal of the first programmable current division network (CDN 302), and a first negative feedback path configured to connect the negative feedback terminal of the first three output terminal current follower circuit (CF$_2$) to the first terminal of the first capacitor $C_1$. The negative output terminal of the three output terminal current follower circuit is configured to connect to an input terminal of the second programmable current division network (CDN 308).

In one aspect, the second three output current follower circuit includes a second capacitor $C_2$ having a positive terminal connected to an output terminal of the second single output current follower circuit (CF$_3$) and a negative terminal connected to ground, a second resistor $R_2$ connected between the positive terminal of the second capacitor $C_2$ and an input terminal (x$_2$) of the second three output terminal current follower circuit (CF$_4$), a second positive feedback path configured to connect the positive feedback terminal of the second three output current follower circuit (CF$_4$) to the first positive feedback path, and a second negative feedback path configured to connect the negative feedback terminal of the second three output current follower amplifier (CF$_4$) to the positive terminal of the second capacitor $C_2$.

In one aspect, a first control input $\beta_1$ is connected to the first programmable current division network (CDN 302). The first control input $\beta_1$ is configured to program a pole frequency $\omega_{01}$ of the first current division network, and a second control input $\beta_2$ is connected to the second programmable current division network. The second control input $\beta_2$ is configured to program a pole frequency $\omega_{02}$ of the second programmable current division network (CDN$_2$), where $\beta_1$ and $\beta_2$ are each selected from a range of 0 to 1, and where $\beta_1 = \beta_2$.

In one aspect, a transfer function of the second order low-pass canonical filter is given by:

$$T(s) = \frac{I_o}{I_i} = \frac{\frac{\beta_1 \beta_2}{R_1 R_2 C_1 C_2}}{s^2 + s\frac{\beta_1}{R_1 C_1} + \frac{\beta_1 \beta_2}{R_1 R_2 C_1 C_2}}.$$

In one aspect, the second order low-pass canonical filter is configured as a unity gain filter.

In one aspect, a pole frequency $\omega_o$ of the second order low-pass canonical filter is given by:

$$\omega_o = \sqrt{\frac{\beta_1 \beta_2}{R_1 R_2 C_1 C_2}}.$$

In one aspect, a quality factor Q of the second order low-pass canonical filter is given by:

$$Q = \sqrt{\frac{\beta_2 R_1 C_1}{\beta_1 R_2 C_2}}.$$

The second embodiment is illustrated with respect to FIG. 2-FIG. 5. The second embodiment describes the method for assembling the second order low-pass canonical filter. The method includes forming a first stage by connecting a current source $I_i$ in series with an input terminal of a first programmable current division network (CDN 302). The method includes connecting a first single output terminal current follower (CF$_1$) in series with the first programmable current division network. The method includes connecting a first three output terminal current follower circuit (CF$_2$) in series with the first single output terminal current follower. The method further includes forming a second stage by connecting a second programmable current division network (CDN 308) in series with a negative output terminal of the first three output terminal current follower circuit (CF$_2$). The method further includes connecting a second single output terminal current follower (CF$_3$) in series with the second programmable current division network. The method further includes connecting a second three output terminal current follower circuit (CF$_4$) in series with the second single output terminal current follower (CF$_3$) and generating a low pass filtered output current $I_0$ at the negative output terminal of the second three output terminal current follower circuit (CF$_4$).

In an aspect, the method further includes configuring the three output terminals of each of the three output terminals of the three output terminal current follower circuits to have a positive feedback terminal, a negative feedback terminal and a negative output terminal.

In an aspect, the method further includes forming the positive feedback terminal by connecting a slewing node of a first op amp to a positive input terminal of a second op amp, wherein the positive feedback terminal is a slewing node of the second op amp; forming the negative output terminal by connecting the slewing node of the first op amp to a positive input terminal of a third op amp and connecting a slewing node of the third op amp to a positive input terminal of a fourth op amp, wherein the negative output terminal is a slewing node of the fourth op amp; and forming the negative feedback terminal by connecting the slewing node of the first op amp to a positive input terminal of a fifth op amp and connecting a slewing node of the fifth op amp to a positive input terminal of a sixth op amp, wherein the negative feedback terminal is a slewing node of the sixth op amp.

In an aspect, the method further includes forming the first three output terminal current follower circuit by connecting a first capacitor having a positive terminal to the output terminal of the first single output terminal current follower circuit and connecting a negative terminal of the first capacitor to ground; connecting a first resistor between the positive terminal of the first capacitor and an input terminal of the first three output terminal current follower circuit; forming a first positive feedback path by connecting the positive feedback terminal of the first three output terminal current follower circuit to the input terminal of the first programmable current division network; forming a first negative feedback path by connecting the negative feedback terminal of the first three output terminal current follower circuit to the first terminal of the first capacitor; and connecting the negative output terminal of the first three output terminal current follower circuit to an input terminal of the second programmable current division network.

In an aspect, the method further includes forming the second three output current follower circuit by connecting a second capacitor having a positive terminal to an output terminal of the second single output current follower circuit and connecting a second terminal of the second capacitor to ground; connecting a second resistor between the positive terminal of the second capacitor and an input terminal of the second three output terminal current follower circuit; forming a second positive feedback path by connecting the first positive feedback terminal of the second three output current follower circuit to the first positive feedback path; and forming a second negative feedback path by connecting the negative feedback terminal of the second three output current follower amplifier to the positive terminal of the second capacitor.

In an aspect, the method further includes connecting a first control input $\beta_1$ to the first programmable current division network, wherein the first control input $\beta_1$ is configured to program a pole frequency $\omega_{01}$ of the first current division network; and connecting a second control input $\beta_2$ to the second programmable current division network, wherein the second control input $\beta_2$ is configured to program a pole frequency $\omega_{02}$ of the second programmable current division network, where $\beta_1$ and $\beta_2$ are each selected from a range of 0 to 1.

In an aspect, the method further includes setting the first control input $\beta_1$ to be equal to the second control input $\beta_2$.

The third embodiment is illustrated with respect to FIG. 2-FIG. 5. The third embodiment describes the method for low pass filtering a current signal. The method includes injecting, by a current source, an input current $I_i$ into a first stage circuit including an input terminal of a first programmable current division network (CDN 302) having a first digital control input $\beta_1$, generating, by the first programmable current division network, a fractional output $\beta_1 I_i$ of the input current $I_i$, transmitting the fractional output $\beta_1 I_i$ to an input terminal of a first single output terminal current follower ($CF_1$), generating, by the first single output terminal current follower ($CF_1$), a first buffered fractional output current, transmitting the first buffered fractional output current to a first three output terminal current follower circuit ($CF_2$) in series with the first single output terminal current follower, generating, by the first three output terminal current follower circuit ($CF_2$), a first stage output current $I_1$, transmitting the first stage output current $I_1$ to a second stage circuit including an input terminal of a second programmable current division network (CDN 308) in series with a negative output terminal of the first three output terminal current follower circuit ($CF_2$), generating, by the second programmable current division network (CDN 308), a fractional output current $\beta_2 I_1$ of the first stage output current $I_1$, transmitting the fractional output current $\beta_2 I_1$ to an input terminal of a second single output terminal current follower ($CF_3$), generating, by the second single output terminal current follower ($CF_1$), a second buffered fractional output current, transmitting the second buffered fractional output current to an input terminal of a second three output terminal current follower circuit ($CF_4$) in series with the second single output terminal current follower ($CF_3$), and generating, by the second three output terminal current follower circuit ($CF_2$), a low pass filtered output current $I_o$ from a negative output terminal of the second three output terminal current follower circuit ($CF_4$).

In an aspect, the first three output terminal current follower circuit further includes a first capacitor having a positive terminal connecting the output terminal of the first single output terminal current follower circuit and a negative terminal connecting to ground; a first resistor connecting the positive terminal of the first capacitor to an input terminal of the first three output terminal current follower circuit; a first positive feedback path connecting a positive feedback terminal of the first three output terminal current follower circuit to the input terminal of the first programmable current division network; and a first negative feedback path connecting the negative feedback terminal of the first three output terminal current follower circuit to the first terminal of the first capacitor, wherein the negative output terminal of the three output terminal current follower circuit is connected to an input terminal of the second programmable current division network.

In an aspect, the first three output terminal current follower circuit further includes a second capacitor having a positive terminal connecting an output terminal of the second single output current follower circuit and a negative terminal connecting to ground; a second resistor connecting the positive terminal of the second capacitor to an input terminal of the second three output terminal current follower circuit; a second positive feedback path connecting a positive feedback terminal of the second three output current follower circuit to the first positive feedback path; and a second negative feedback path connecting the negative feedback terminal of the second three output current follower amplifier to the positive terminal of the second capacitor.

In an aspect, the method further includes programming a pole frequency $\omega_{01}$ of the first current division network by the digital control input $\beta_1$ of the first programmable current division network, and programming a pole frequency $\omega_{02}$ of the second programmable current division network of the second programmable current division network, where $\beta_1$ and $\beta_2$ are each selected from a range of 0 to 1.

Next, further details of the hardware description of the computing environment of FIG. 3 according to exemplary embodiments is described with reference to FIG. 6.

Figure 6:
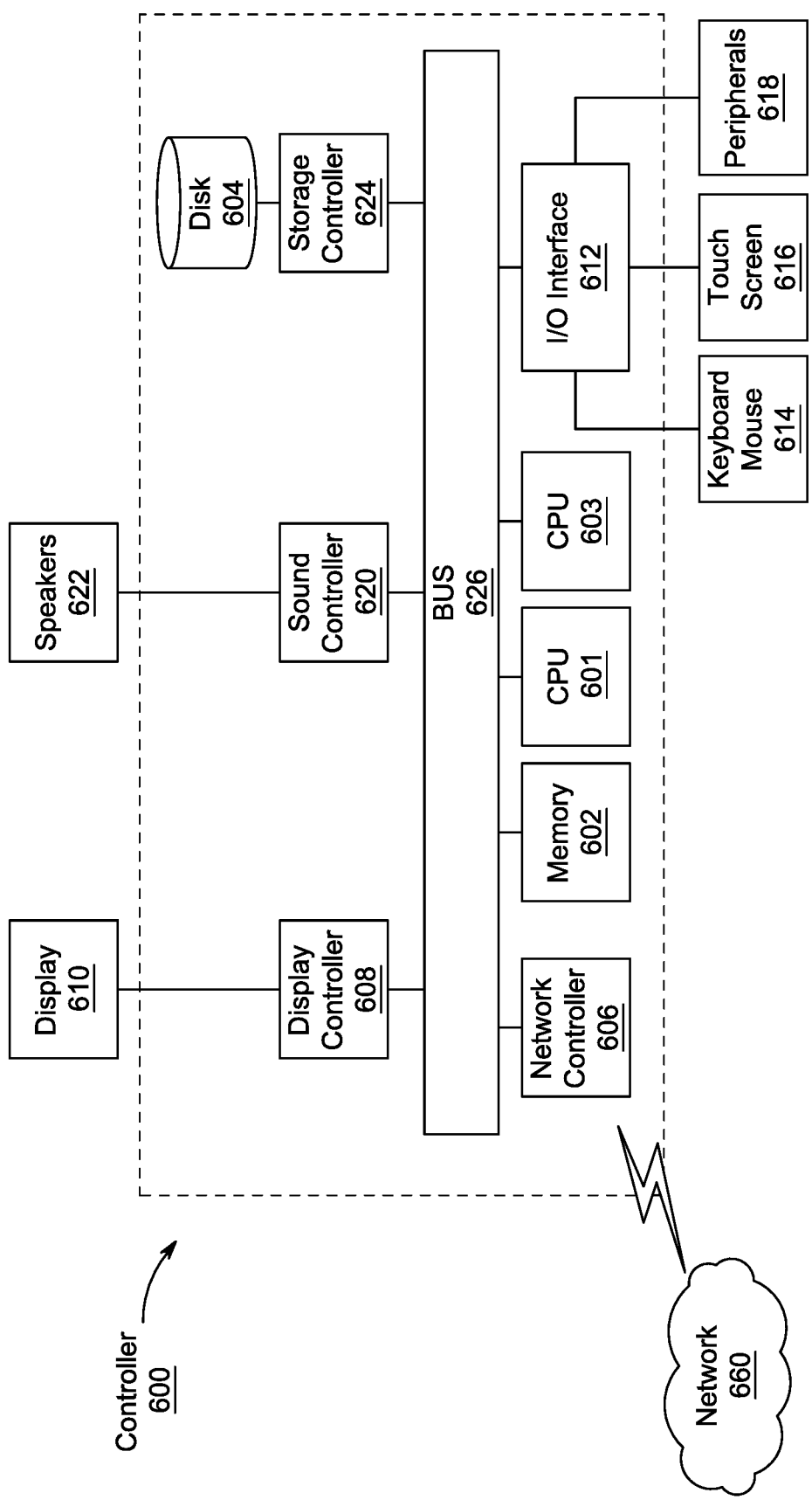
FIG. 6 is an illustration of a non-limiting example of details of computing hardware used in the computing system, according to certain embodiments.

In FIG. 6, the controller 600 is described in which programming of the center frequencies of the second order low-pass canonical filter 300 is performed by a computing device which includes a CPU 601 which performs the processes described above/below. FIG. 6 is an illustration of a non-limiting example of details of computing hardware used in the computing system, according to exemplary aspects of the present disclosure. In FIG. 6, a controller 600 is described which is a computing device (that includes the microcontroller) and includes a CPU 601 which performs the processes described above/below. The process data and instructions may be stored in memory 602. These processes and instructions may also be stored on a storage medium disk 604 such as a hard drive (HDD) or portable storage medium or may be stored remotely.

Further, the claims are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, the claims may be provided as a utility application, background daemon, or component of an operating system, or combination thereof, executing in conjunction with CPU 601, 603 and an operating system such as Microsoft Windows 7, UNIX, Solaris, LINUX, Apple MAC-OS and other systems known to those skilled in the art.

The hardware elements in order to achieve the computing device may be realized by various circuitry elements, known to those skilled in the art. For example, CPU 601 or CPU 603 may be a Xenon or Core processor from Intel of America or an Opteron processor from AMD of America, or may be other processor types that would be recognized by one of ordinary skill in the art. Alternatively, the CPU 601, 603 may be implemented on an FPGA, ASIC, PLD or using discrete logic circuits, as one of the ordinary skill in the art would recognize. Further, CPU 601, 603 may be implemented as multiple processors cooperatively working in parallel to perform the instructions of the inventive processes described above.

The computing device in FIG. 6 also includes a network controller 606, such as an Intel Ethernet PRO network interface card from Intel Corporation of America, for interfacing with network 660. As can be appreciated, the network 660 can be a public network, such as the Internet, or a private network such as an LAN or WAN network, or any combination thereof and can also include PSTN or ISDN sub-networks. The network 660 can also be wired, such as an Ethernet network, or can be wireless such as a cellular network including EDGE, 3G and 4G wireless cellular systems. The wireless network can also be WiFi, Bluetooth, or any other wireless form of communication that is known.

The computing device further includes a display controller 608, such as a NVIDIA Geforce GTX or Quadro graphics adaptor from NVIDIA Corporation of America for interfacing with display 610, such as a Hewlett Packard HPL2445w LCD monitor. A general purpose I/O interface 612 interfaces with a keyboard and/or mouse 614 as well as a touch screen panel 616 on or separate from display 610. General purpose I/O interface also connects to a variety of peripherals 618 including printers and scanners, such as an OfficeJet or DeskJet from Hewlett Packard.

A sound controller 620 is also provided in the computing device such as Sound Blaster X-Fi Titanium from Creative, to interface with speakers/microphone 622 thereby providing sounds and/or music.

The general-purpose storage controller 624 connects the storage medium disk 604 with communication bus 626, which may be an ISA, EISA, VESA, PCI, or similar, for interconnecting all of the components of the computing device. A description of the general features and functionality of the display 610, keyboard and/or mouse 614, as well as the display controller 608, storage controller 624, network controller 606, sound controller 620, and general purpose I/O interface 612 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 7.

Figure 7:
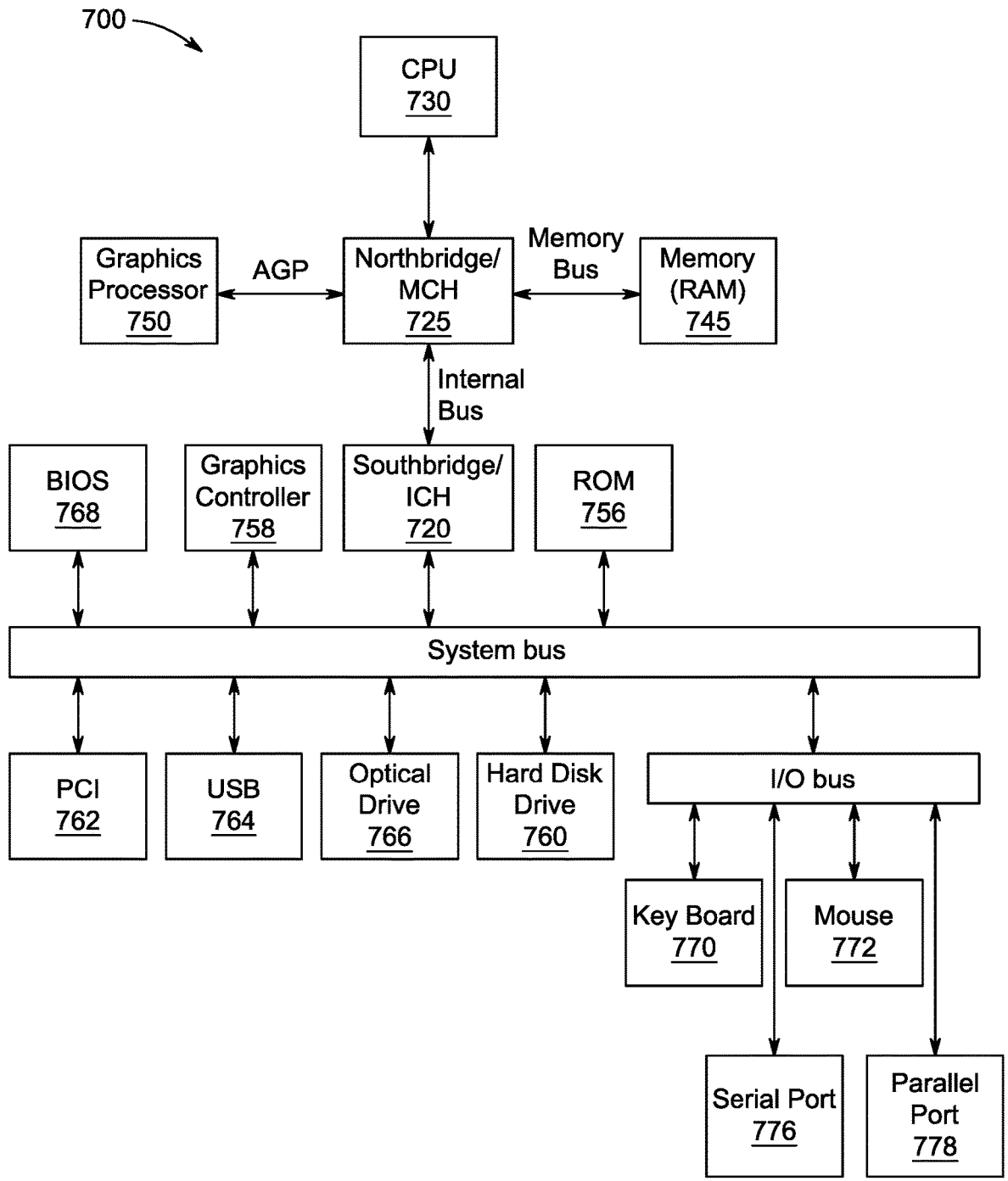
FIG. 7 is an exemplary schematic diagram of a data processing system used within the computing system, according to certain embodiments.

FIG. 7 shows a schematic diagram of a data processing system 700 used within the computing system, according to exemplary aspects of the present disclosure. The data processing system 700 is an example of a computer in which code or instructions implementing the processes of the illustrative aspects of the present disclosure may be located.

In FIG. 7, data processing system 780 employs a hub architecture including a north bridge and memory controller hub (NB/MCH) 725 and a south bridge and input/output (I/O) controller hub (SB/ICH) 720. The central processing unit (CPU) 730 is connected to NB/MCH 725. The NB/MCH 725 also connects to the memory 745 via a memory bus, and connects to the graphics processor 750 via an accelerated graphics port (AGP). The NB/MCH 725 also connects to the SB/ICH 720 via an internal bus (e.g., a unified media interface or a direct media interface). The CPU Processing unit 730 may contain one or more processors and even may be implemented using one or more heterogeneous processor systems.

Figure 8:
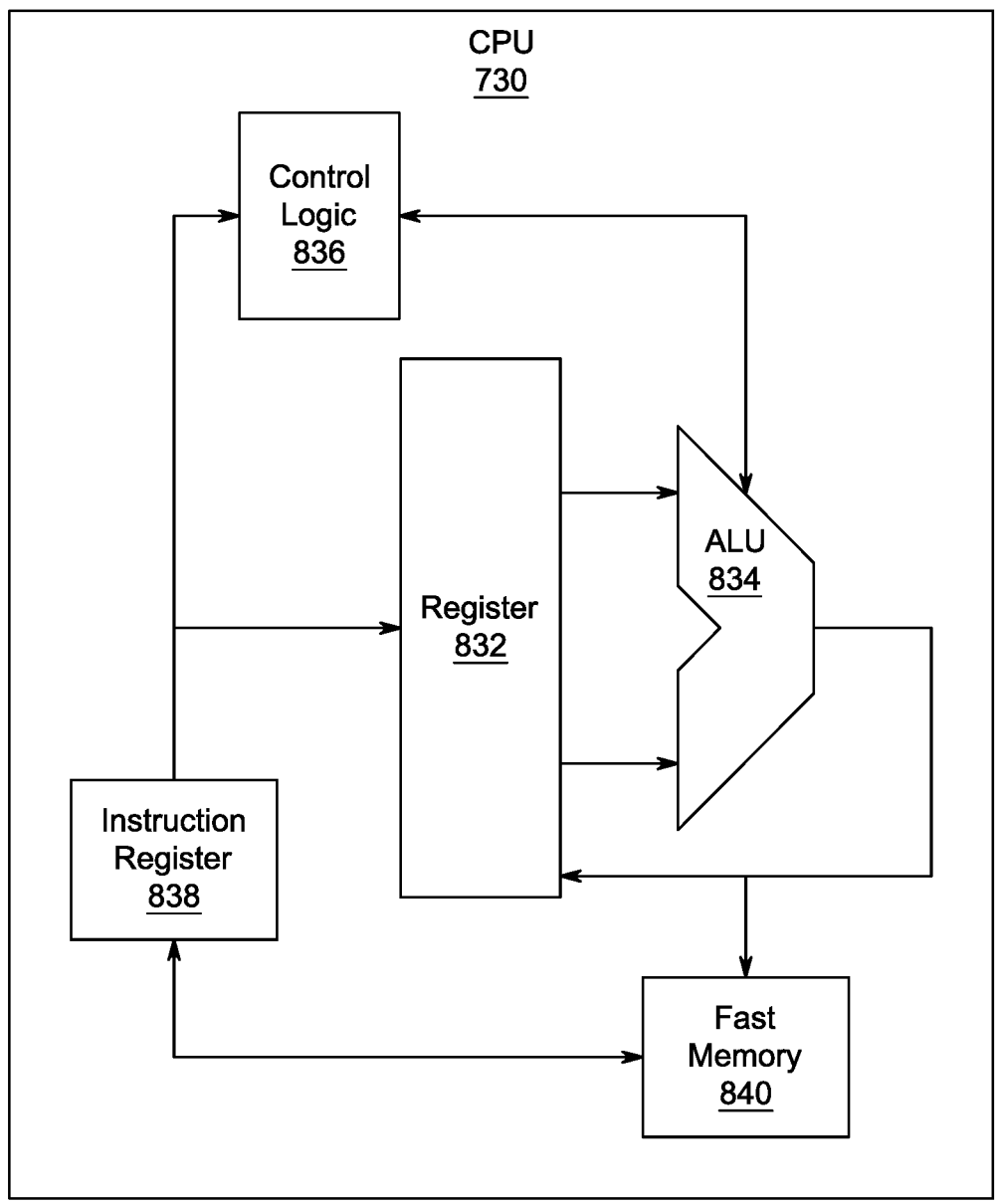
FIG. 8 is an exemplary schematic diagram of a processor used with the computing system, according to certain embodiments.

For example, FIG. 8 shows one aspects of the present disclosure of CPU 730. In one aspects of the present disclosure, the instruction register 838 retrieves instructions from the fast memory 840. At least part of these instructions is fetched from the instruction register 838 by the control logic 836 and interpreted according to the instruction set architecture of the CPU 730. Part of the instructions can also be directed to the register 832. In one aspects of the present disclosure the instructions are decoded according to a hardwired method, and in another aspect of the present disclosure the instructions are decoded according to a microprogram that translates instructions into sets of CPU configuration signals that are applied sequentially over multiple clock pulses. After fetching and decoding the instructions, the instructions are executed using the arithmetic logic unit (ALU) 834 that loads values from the register 832 and performs logical and mathematical operations on the loaded values according to the instructions. The results from these operations can be feedback into the register and/or stored in the fast memory 840. According to certain aspects of the present disclosures, the instruction set architecture of the CPU 730 can use a reduced instruction set architecture, a complex instruction set architecture, a vector processor architecture, a very large instruction word architecture. Furthermore, the CPU 730 can be based on the Von Neuman model or the Harvard model. The CPU 730 can be a digital signal processor, an FPGA, an ASIC, a PLA, a PLD, or a CPLD. Further, the CPU 730 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 7, the data processing system 780 can include that the SB/ICH 720 is coupled through a system bus to an I/O Bus, a read only memory (ROM) 756, universal serial bus (USB) port 764, a flash binary input/output system (BIOS) 768, and a graphics controller 758. PCI/PCIe devices can also be coupled to SB/ICH 720 through a PCI bus 762.

The PCI devices may include, for example, Ethernet adapters, add-in cards, and PC cards for notebook computers. The Hard disk drive 760 and CD-ROM 756 can use, for example, an integrated drive electronics (IDE) or serial advanced technology attachment (SATA) interface. In one aspect of the present disclosure the I/O bus can include a super I/O (SIO) device.

Further, the hard disk drive (HDD) 760 and optical drive 766 can also be coupled to the SB/ICH 720 through a system bus. In one aspects of the present disclosure, a keyboard 770, a mouse 772, a parallel port 778, and a serial port 776 can be connected to the system bus through the I/O bus. Other peripherals and devices that can be connected to the SB/ICH 720 using a mass storage controller such as SATA or PATA, an Ethernet port, an ISA bus, an LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry or based on the requirements of the intended back-up load to be powered.

Figure 9:
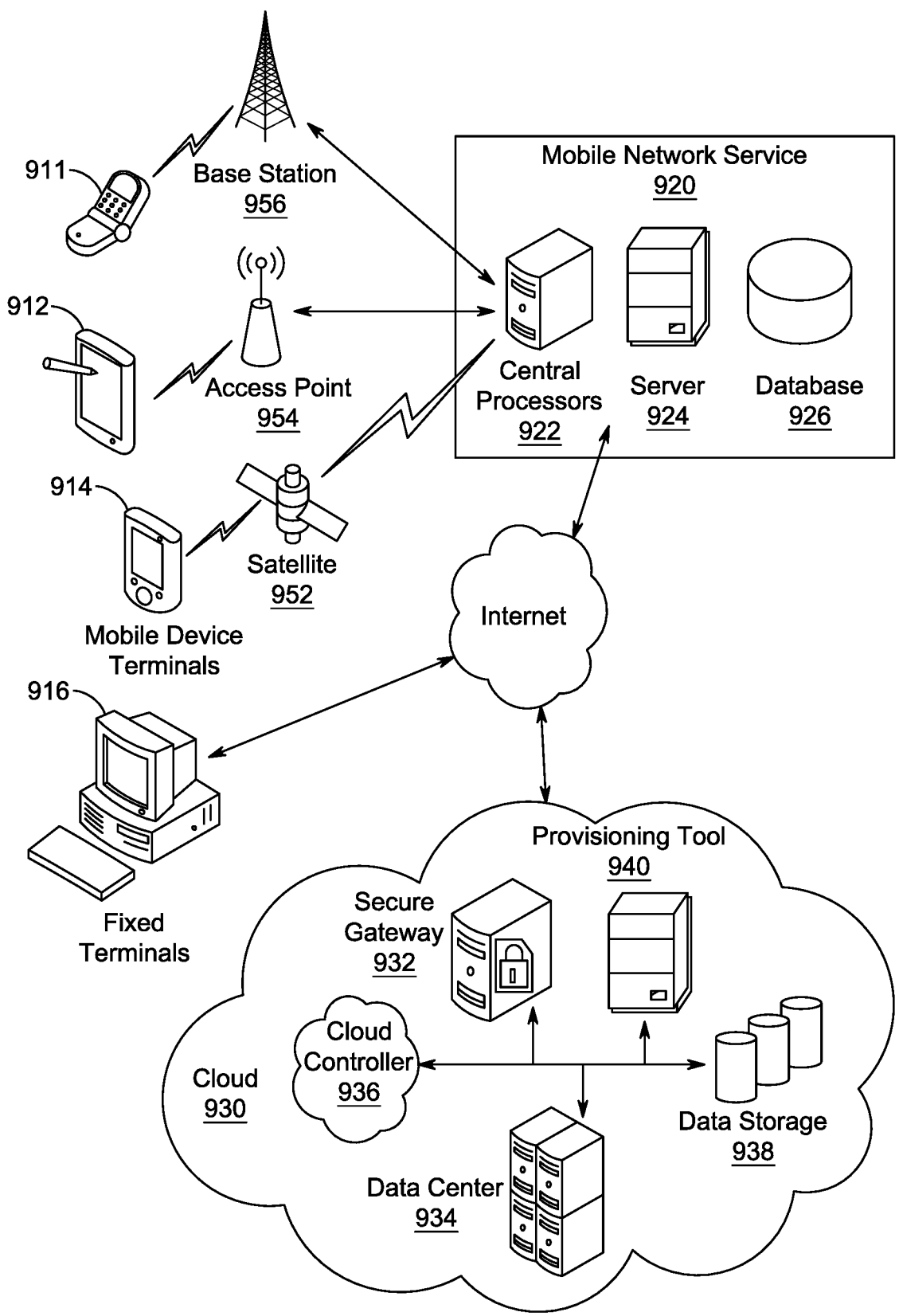
FIG. 9 is an illustration of a non-limiting example of distributed components which may share processing with the controller, according to certain embodiments.

The functions and features described herein may also be executed by various distributed components of a system. For example, one or more processors may execute these system functions, wherein the processors are distributed across multiple components communicating in a network. The distributed components may include one or more client and server machines, which may share processing, as shown by FIG. 9, in addition to various human interface and communication devices (e.g., display monitors, smart phones, tablets, personal digital assistants (PDAs)). More specifically, FIG. 9 illustrates client devices including smart phone 911, tablet 912, mobile device terminal 914 and fixed terminals 916. These client devices may be commutatively coupled with a mobile network service 920 via base station 956, access point 954, satellite 952 or via an internet connection. Mobile network service 920 may comprise central processors 922, server 924 and database 926. Fixed terminals 916 and mobile network service 920 may be commutatively coupled via an internet connection to functions in cloud 930 that may comprise security gateway 932, data center 934, cloud controller 936, data storage 938 and provisioning tool 940. The network may be a private network, such as a LAN or WAN, or may be a public network, such as the Internet. Input to the system may be received via direct user input and received remotely either in real-time or as a batch process. Additionally, some aspects of the present disclosures may be performed on modules or hardware not identical to those described. Accordingly, other aspects of the present disclosures are within the scope that may be claimed.

The above-described hardware description is a non-limiting example of corresponding structure for performing the functionality described herein.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A second order low-pass canonical filter, comprising:
a first stage including:
    a current source ($I_i$) connected in series with an input terminal of a first programmable current division network;
    a first single output terminal current follower in series with the first programmable current division network;
    a first three output terminal current follower circuit in series with the first single output terminal current follower;
a second stage including:
    a second programmable current division network in series with a negative output terminal of the first three output terminal current follower circuit;
    a second single output terminal current follower in series with the second programmable current division network; and
    a second three output terminal current follower circuit in series with the second single output terminal current follower, wherein a negative output terminal of the second three output terminal current follower circuit is configured to generate a low pass filtered output current ($I_o$),
wherein the three output terminals of each of the three output terminal current follower circuits are configured to have a positive feedback terminal, a negative feedback terminal and a negative output terminal, and
wherein the first three output terminal current follower circuit comprises:
    a first capacitor having a positive terminal connected to the output terminal of the first single output terminal current follower circuit and a negative terminal connected to ground;
    a first resistor connected between the positive terminal of the first capacitor and an input terminal of the first three output terminal current follower circuit;
    a first positive feedback path configured to connect the positive feedback terminal of the first three output terminal current follower circuit to the input terminal of the first programmable current division network; and
    a first negative feedback path configured to connect the negative feedback terminal of the first three output terminal current follower circuit to the first terminal of the first capacitor,
    wherein the negative output terminal of the three output terminal current follower circuit is configured to connect to an input terminal of the second programmable current division network.

2. The second order low-pass canonical filter of claim 1, wherein the second three output current follower circuit comprises:
    a second capacitor having a positive terminal connected to an output terminal of the second single output current follower circuit and a negative terminal connected to ground;

a second resistor connected between the positive terminal of the second capacitor and an input terminal of the second three output terminal current follower circuit;
a second positive feedback path configured to connect the positive feedback terminal of the second three output current follower circuit to the first positive feedback path; and
a second negative feedback path configured to connect the negative feedback terminal of the second three output current follower amplifier to the positive terminal of the second capacitor.

3. The second order low-pass canonical filter of claim 2, further comprising:
a first control input ($\beta_1$) connected to the first programmable current division network, wherein the first control input is configured to program a pole frequency ($\omega_{01}$) of the first current division network; and
a second control input ($\beta_2$) connected to the second programmable current division network, wherein the second control input ($\beta_2$) is configured to program a pole frequency ($\omega_{02}$) of the second programmable current division network, where $\beta_1$ and $\beta_2$ are each selected from a range of 0 to 1.

4. The second order low-pass canonical filter of claim 3, wherein $\beta_1=\beta_2$.

5. The second order low-pass canonical filter of claim 4, wherein a pole frequency ($\omega_0$) of the second order low-pass canonical filter is given by:

$$\omega_0 = \sqrt{\frac{\beta_1 \beta_2}{R_1 R_2 C_1 C_2}}.$$

6. The second order low-pass canonical filter of claim 4, wherein a quality factor (Q) of the second order low-pass canonical filter is given by:

$$Q = \sqrt{\frac{\beta_2 R_1 C_1}{\beta_1 R_2 C_2}}.$$

7. A method for assembling a second order low-pass canonical filter, comprising:
forming a first stage by:
connecting a current source ($I_i$) in series with an input terminal of a first programmable current division network;
connecting a first single output terminal current follower in series with the first programmable current division network;
connecting a first three output terminal current follower circuit in series with the first single output terminal current follower;
forming a second stage by:
connecting a second programmable current division network in series with a negative output terminal of the first three output terminal current follower circuit;
connecting a second single output terminal current follower in series with the second programmable current division network;
connecting a second three output terminal current follower circuit in series with the second single output terminal current follower; and generating a low pass filtered output current ($I_0$) at the negative output terminal of the second three output terminal current follower circuit,
configuring the three output terminals of each of the three output terminals of the three output terminal current follower circuits to have a positive feedback terminal, a negative feedback terminal and a negative output terminal,
forming the positive feedback terminal by connecting a slewing node of a first op amp to a positive input terminal of a second op amp, wherein the positive feedback terminal is a slewing node of the second op amp;
forming the negative output terminal by connecting the slewing node of the first op amp to a positive input terminal of a third op amp and connecting a slewing node of the third op amp to a positive input terminal of a fourth op amp, wherein the negative output terminal is a slewing node of the fourth op amp; and
forming the negative feedback terminal by connecting the slewing node of the first op amp to a positive input terminal of a fifth op amp and connecting a slewing node of the fifth op amp to a positive input terminal of a sixth op amp, wherein the negative feedback terminal is a slewing node of the sixth op amp.

8. The method of claim 7, further comprising forming the first three output terminal current follower circuit by:
connecting a first capacitor having a positive terminal to the output terminal of the first single output terminal current follower circuit and connecting a negative terminal of the first capacitor to ground;
connecting a first resistor between the positive terminal of the first capacitor and an input terminal of the first three output terminal current follower circuit;
forming a first positive feedback path by connecting the positive feedback terminal of the first three output terminal current follower circuit to the input terminal of the first programmable current division network;
forming a first negative feedback path by connecting the negative feedback terminal of the first three output terminal current follower circuit to the first terminal of the first capacitor; and
connecting the negative output terminal of the first three output terminal current follower circuit to an input terminal of the second programmable current division network.

9. The method of claim 8, further comprising forming the second three output current follower circuit by:
connecting a second capacitor having a positive terminal to an output terminal of the second single output current follower circuit and connecting a second terminal of the second capacitor to ground;
connecting a second resistor between the positive terminal of the second capacitor and an input terminal of the second three output terminal current follower circuit;
forming a second positive feedback path by connecting the first positive feedback terminal of the second three output current follower circuit to the first positive feedback path; and
forming a second negative feedback path by connecting the negative feedback terminal of the second three output current follower amplifier to the positive terminal of the second capacitor.

10. The method of claim 7, further comprising: connecting a first control input ($\beta_1$) to the first programmable current division network, wherein the first control input ($\beta_1$) is configured to program a pole frequency ($\omega_{01}$) of the first current division network; and connecting a second control input ($\beta_2$) to the second programmable current division network, wherein the second control input ($\beta_2$) is configured to program a pole frequency ($\omega_{02}$) of the second programmable current division network, where $\beta_1$ and $\beta_2$ are each selected from a range of 0 to 1.

11. The method of claim 10, further comprising: setting the first control input ($\beta_1$) to be equal to the second control input ($\beta_2$).

12. A method for low pass filtering a current signal, comprising: injecting, by a current source, an input current ($I_i$) into a first stage circuit including an input terminal of a first programmable current division network having a first digital control input ($\beta_1$); generating, by the first programmable current division network, a fractional output ($\beta_1 I_i$) of the input current ($I_i$); transmitting the fractional output ($\beta_1 I_i$) to an input terminal of a first single output terminal current follower; generating, by the first single output terminal current follower, a first buffered fractional output current; transmitting the first buffered fractional output current to a first three output terminal current follower circuit in series with the first single output terminal current follower; generating, by the first three output terminal current follower circuit, a first stage output current ($I_i$); transmitting the first stage output current ($I_i$) to a second stage circuit including an input terminal of a second programmable current division network in series with a negative output terminal of the first three output terminal current follower circuit; generating, by the second programmable current division network, a fractional output current ($\beta_2 I_i$) of the first stage output current ($I_i$); transmitting the fractional output current ($\beta_2 I_i$) to an input terminal of a second single output terminal current follower; generating, by the second single output terminal current follower, a second buffered fractional output current; transmitting the second buffered fractional output current to an input terminal of a second three output terminal current follower circuit in series with the second single output terminal current follower; and generating, by the second three output terminal current follower circuit, a low pass filtered output current ($I_o$) from a negative output terminal of the second three output terminal current follower circuit.

13. The method of claim 12, wherein the first three output terminal current follower circuit further comprises:

a first capacitor having a positive terminal connecting the output terminal of the first single output terminal current follower circuit and a negative terminal connecting to ground;

a first resistor connecting the positive terminal of the first capacitor to an input terminal of the first three output terminal current follower circuit;

a first positive feedback path connecting a positive feedback terminal of the first three output terminal current follower circuit to the input terminal of the first programmable current division network; and a first negative feedback path connecting the negative feedback terminal of the first three output terminal current follower circuit to the first terminal of the first capacitor, wherein the negative output terminal of the three output terminal current follower circuit is connected to an input terminal of the second programmable current division network.

14. The method of claim 13, wherein the first three output terminal current follower circuit further comprises:

a second capacitor having a positive terminal connecting an output terminal of the second single output current follower circuit and a negative terminal connecting to ground;

a second resistor connecting the positive terminal of the second capacitor to an input terminal of the second three output terminal current follower circuit;

a second positive feedback path connecting a positive feedback terminal of the second three output current follower circuit to the first positive feedback path; and a second negative feedback path connecting the negative feedback terminal of the second three output current follower amplifier to the positive terminal of the second capacitor.

15. The method of claim 14, further comprising: programming a pole frequency ($\omega_{01}$) of the first current division network by the digital control input ($\beta_1$) of the first programmable current division network, and programming a pole frequency ($\omega_{02}$) of the second programmable current division network of the second programmable current division network, where $\beta_1$ and $\beta_2$ are each selected from a range of 0 to 1.

* * * * *